United States Patent
Natori et al.

(10) Patent No.: US 7,091,538 B2
(45) Date of Patent: Aug. 15, 2006

(54) SEMICONDUCTOR DEVICE AND METHOD FOR MANUFACTURING THE SAME

(75) Inventors: Katsuaki Natori, Yokohama (JP); Koji Yamakawa, Tokyo (JP); Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/954,183

(22) Filed: Oct. 1, 2004

(65) Prior Publication Data

US 2005/0110062 A1    May 26, 2005

(30) Foreign Application Priority Data

Oct. 6, 2003    (JP)    ............................. 2003-346926

(51) Int. Cl.
*H01L 29/76*    (2006.01)
(52) U.S. Cl. ...................... 257/295; 438/244; 257/306
(58) Field of Classification Search .................. None
See application file for complete search history.

(56) References Cited

U.S. PATENT DOCUMENTS 6,762,445 B1 *    7/2004   Ogawa et al. .............. 257/296

FOREIGN PATENT DOCUMENTS

| JP | 08046155 A | * | 2/1996 |
| JP | 2002-289810 | | 10/2002 |

* cited by examiner

*Primary Examiner*—Leonardo Andujar
(74) *Attorney, Agent, or Firm*—Oblon, Spivak, McClelland, Maier & Neustadt, P.C.

(57) ABSTRACT

A semiconductor device comprises a semiconductor substrate including a diffusion area, a capacitor provided above the semiconductor substrate and including a lower electrode, a dielectric film, and an upper electrode, a plug provided between the semiconductor substrate and the capacitor and having a lower end connected to the diffusion area and an upper end connected to the lower electrode, and a dummy plug provided between the semiconductor substrate and the capacitor and having a lower end not connected to the diffusion area and an upper end connected to the lower electrode.

20 Claims, 6 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2003-346926, filed Oct. 6, 2003, the entire contents of which are incorporated herein by reference.

BACKGROUND OF THE INVENTION

1. Field of the Invention

The present invention relates to a semiconductor device including a capacitor provided above a semiconductor substrate and a plug which connects the capacitor and a diffusion area on a surface of the semiconductor substrate and a method for manufacturing the same.

2. Description of the Related Art

In recent years, much effort has been made to develop ferroelectric random access memories (FeRAM) that are nonvolatile memories utilizing a ferroelectric thin film. As a capacitor dielectric film in the FeRAM, a ferroelectric thin film is used which comprises a material such as PZT (Pb (Zrx, Ti$_{1-x}$O$_3$), BIT (Bi$_4$Ti$_3$O$_2$), SBT (SrBi$_2$T$_2$O$_9$), or the like.

For capacitor structures, much effort has been made to develop COP (Capacitor On Plug) structure having a capacitor placed on a plug (for example, Jpn. Pat. Appln. KOKAI Publication No. 2002-289810). In the COP structure, a plug connected to an active area of a transistor is placed immediately below the capacitor. Thus, the employment of the COP structure enables a reduction in cell size as in the case of a stacked capacitor structure for a DRAM.

In a process of manufacturing an FeRAM, thermal treatment is carried out in an oxygen-containing atmosphere in order to recover from damage to the capacitor dielectric film. On this occasion, the plug under the capacitor is oxidized. The oxidized capacitor may increase the contact resistance between the plug and a lower electrode of the capacitor or cause the lower electrode to peel off.

To prevent an increase in contact resistance and peel-off of the lower electrode, attempts have been made to use a noble metal such as iridium, as a material for the lower electrode. This is because the noble metal does not allow oxygen to pass through easily and remains conductive even after oxidation.

On the other hand, silicon is often used as a material for the plug. In this case, since the noble metal is likely to react with silicon, a metal silicide film such as a titanium silicide film is provided between the plug (Si) and the lower electrode (noble metal) as a barrier film.

An oxide film is prone to be formed on a surface of the metal silicide film. Thus, an oxide film formed on the surface of the metal silicide film is removed by, for example, a process using a diluted fluoric acid before the lower electrode is formed.

Figure 13:
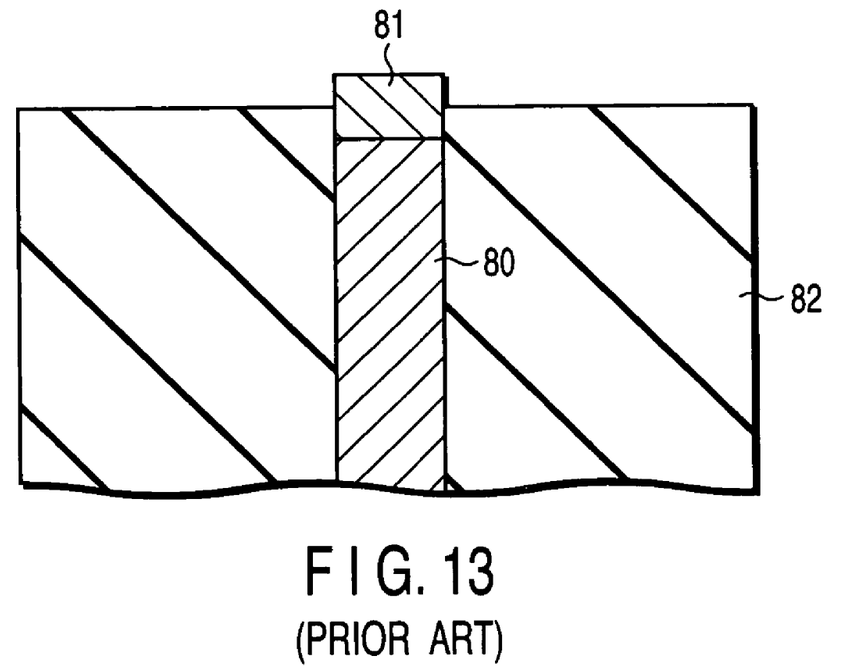
FIG. 13 is a diagram illustrating problems with a conventional plug structure.

In this case, the metal silicide film is etched at a lower etching rate than a surrounding silicon oxide film in which the plug is buried. As a result, as shown in FIG. 13, an upper part of a metal silicide film 81 on a plug 80 projects from a surface of a silicon oxide film 82. When there is such a projection of the metal silicide film 81 (a plug structure with a step) below an area in which the lower electrode is formed, the lower electrode is prone to peel off. Further, the projecting part of the metal silicide film 81 may be cracked. In this case, oxygen passes through the crack and reaches the inside of the plug 80. As a result, the plug 80 is oxidized to increase the contact resistance.

BRIEF SUMMARY OF THE INVENTION

According to an aspect of the present invention, there is provided a semiconductor device comprising: a semiconductor substrate including a diffusion area; a capacitor provided above the semiconductor substrate and including a lower electrode, a dielectric film, and an upper electrode; a plug provided between the semiconductor substrate and the capacitor and having a lower end connected to the diffusion area and an upper end connected to the lower electrode; and a dummy plug provided between the semiconductor substrate and the capacitor and having a lower end not connected to the diffusion area and an upper end connected to the lower electrode.

According to an aspect of the present invention, there is provided a method for manufacturing a semiconductor device comprising: forming an insulating film on a semiconductor substrate including a diffusion area; forming a connection hole in the insulating film which reaches the diffusion area and forming a trench in a surface of the insulating film; filling an inside of the connection hole and trench with a semiconductor film; forming a refractory metal film on the insulating film and semiconductor film; executing a thermal treatment to allow the semiconductor film and the refractory metal film to react with each other to form a compound film of the semiconductor film and refractory metal film; removing the refractory metal film and compound film outside the connection hole and trench and forming a plug and a dummy plug each including the semiconductor film and the refractory metal film inside the connection hole and the trench, respectively; removing an oxide film formed on a surface of the compound film; burying metal or its compound in a removed area in a surface of the insulating film between the connection hole and the trench which area results from the removal of the oxide film; and forming a capacitor including a lower electrode, a dielectric film, and an upper electrode on the insulating film, the lower electrode having a lower end being connected to upper ends of the plug and dummy plug.

DETAILED DESCRIPTION OF THE INVENTION

An embodiment of the present invention will be described below with reference to the drawings.

Figure 1:
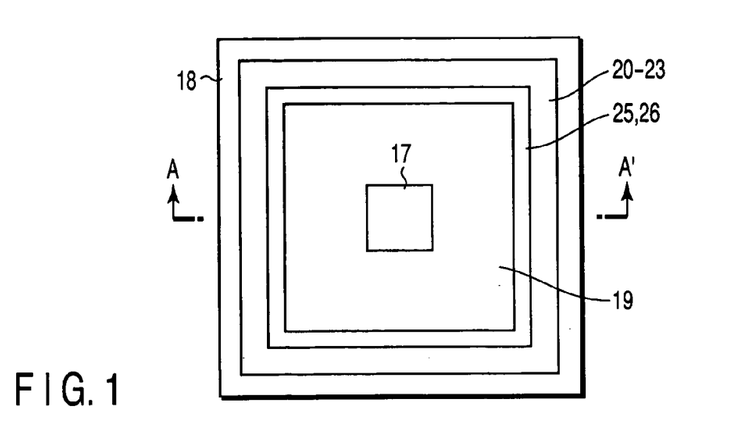
FIG. 1 is a plan view showing a COP type FeRAM according to an embodiment of the present invention.
Figure 2:
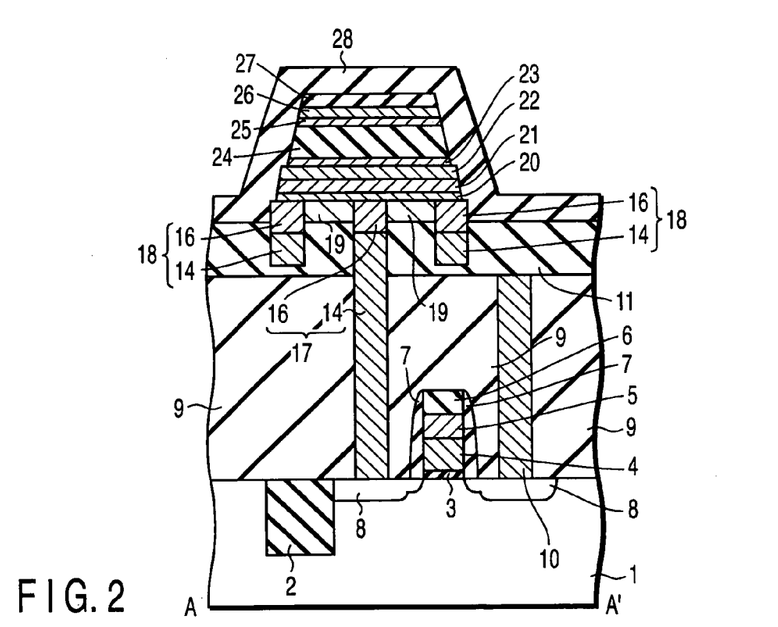
FIG. 2 is a sectional view taken along a line segment A–A' in the plan view in FIG. 1.

FIG. 1 is a plan view showing a COP type FeRAM according to an embodiment of the present invention. FIG. 2 is a sectional view taken along a line segment A–A' in the plan view in FIG. 1.

The COP type FeRAM according to the present embodiment comprises a silicon substrate 1 including source/drain areas (diffusion areas) 8, a capacitor provided above the silicon substrate 1 and including lower electrodes 20 to 23, a PZT film (capacitor dielectric film) 24, and upper electrodes 25 and 26, a plug 17 provided between the silicon substrate 1 and the capacitor and having a lower end connected to one of the source/drain areas 8 and an upper end connected to the lower electrodes 20 to 23, and a dummy plug 18 provided between the silicon substrate 1 and the capacitor and having a lower end not connected to the source/drain areas 8 and an upper end connected to the lower electrodes 20 to 23.

The dummy plug 18 is placed below an area including the periphery and outside of the lower electrodes 20 to 23. The upper ends of the plug 17 and dummy plug 18 project from a surface of a silicon oxide film 11. A titanium film 19 (a buried member) is buried in the area between the upper ends of the plug 17 and dummy plug 18, projecting from the surface of silicon oxide film 11. A titanium compound film, for example, titanium nitride film, can be used in place of the titanium film 19.

The plug 17 and the dummy plug 18 are simultaneously formed during the same process as described later. Thus, the plug 17 and the dummy plug 18 made of the same material. The plug 17 and dummy plug 18, projecting from the surface of the silicon oxide film 11, is made of a metal silicide film 16 etched at a lower etching rate than the lower electrode 20 and titanium film 19 (buried member). The plug 17 and dummy plug 18 in the silicon oxide film 11 are made of a polycrystalline silicon film 14.

FIGS. 3 to 11 are sectional views showing a process of manufacturing a COP type FeRAM according to the present embodiment. The sectional views in these figures are taken along the line segment A–A'.

Figure 3:
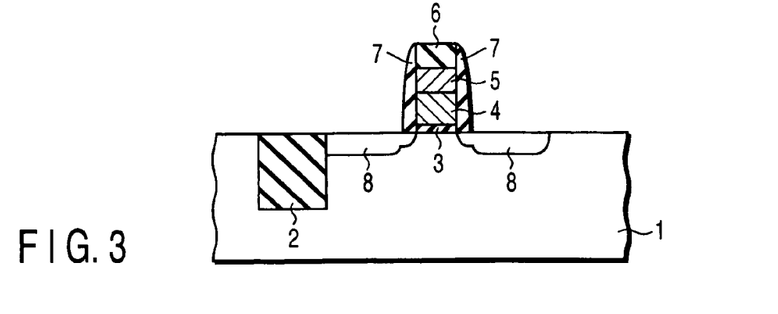
FIG. 3 is a sectional view showing a process of manufacturing a COP type FeRAM according to the embodiment.

First, as shown in FIG. 3, a trench for element isolation is formed in a part of area of the surface of the p-type silicon substrate 1, the part of the area is different from transistor active areas. An insulator such as $SiO_2$ is buried in the trench to form a shallow trench isolation (STI) area 2.

Then, as shown in FIG. 3, a MOS transistor (cell transistor) is formed to perform a switching operation. The MOS transistor comprises a gate insulating film 3, gate electrodes 4 and 5, a gate upper insulating film 6, a gate side wall insulating film (spacer) 7, and source/drain areas 8. The gate electrode 4 is made of an $n^+$ type polycrystalline silicon film, while the gate electrode 5 is made of a tungsten silicide film.

Specifically, the process for the MOS transistor is as described below.

First, a silicon oxide film (gate insulating film 3) of thickness 6 nm is formed on the surface of the silicon substrate 1 by thermal oxidation. Subsequently, an $n^+$ type polysilicon film (gate electrode 4) doped with arsenate is formed all over the surface of the silicon oxide film. Moreover, a tungsten silicide film (gate electrode 5) and a silicon nitride film (gate upper insulating film 6) are formed on the $n^+$ type polycrystalline silicon film.

Then, a normal photolithography and RIE (Reactive Ion Etching) processes are used to process the silicon oxide film, the $n^+$ type polycrystalline silicon film, the tungsten silicide film, and the silicon nitride film to form a gate insulating film 3, gate electrodes 4 and 5 (polycide gates), and a gate upper insulating film 6.

Then, the gate upper insulating film 6 is used as a mask to implant n-type impurity ions in the surface of the silicon substrate 1 by an ion implantation process.

Then, a silicon nitride (gate side wall insulating film 7) is deposited all over the surface of the substrate 1. The silicon nitride film is then etched by the RIE process to form a gate side wall insulating film 7 on side walls of the respective gate electrodes 4 and 5.

Then, the gate upper insulating film 6 and the gate side wall insulating film 7 are used as a mask to implant n-type impurity ions in the surface of the silicon substrate 1 by the ion implantation process. Subsequently, the n-type impurity ions are activated by a thermal treatment (anneal) to form a pair of source/drain areas 8 including extensions.

Figure 4:
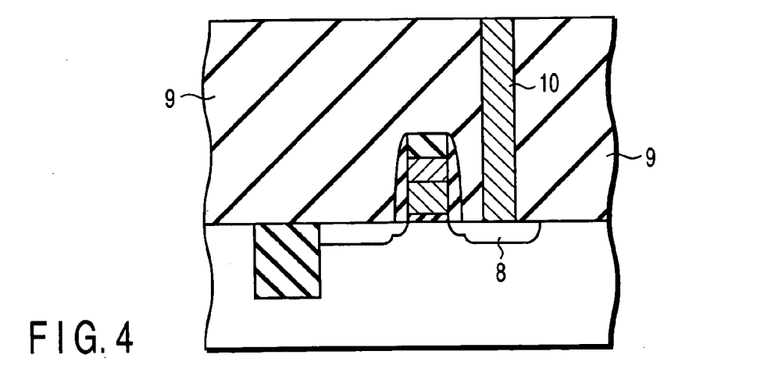
FIG. 4 is a sectional view showing a continued part of the process of manufacturing a COP type FeRAM according to the embodiment, shown in FIG. 3.

Then, the process proceeds to the step shown in FIG. 4. First, a silicon oxide film 9 is deposited all over the surface of the substrate 1. Subsequently, the surface of the silicon oxide film 9 is flattened by a CMP (Chemical Mechanical Polishing) process.

Then, a contact hole is opened in the silicon oxide film 9 so as to communicate with one of the source/drain areas 8 in the MOS transistor. Subsequently, a polycrystalline silicon film is deposited all over the surface by the CVD process so as to be buried in the contact hole. Subsequently, the polycrystalline silicon film outside the contact hole is removed by the CMP process. As a result, a plug 10 comprises polycrystalline silicon film is formed.

If a aspect ratio of the contact hole is not high (a relatively flat capacitor structure is formed), a sputter process can be used in place of the CVD process.

Figure 5:
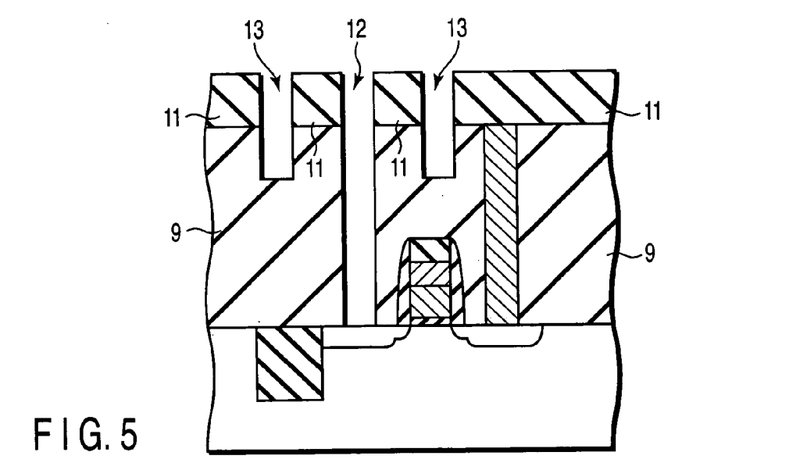
FIG. 5 is a sectional view showing a continued part of the process of manufacturing a COP type FeRAM according to the embodiment, shown in FIG. 4.

Then, the process proceeds the step shown in FIG. 5. First, the silicon oxide film 11 is deposited on the silicon oxide film 9. Subsequently, a contact hole 12 is opened in the silicon oxide films 9 and 11 so as to communicate with the other of the source/drain areas 8 in the MOS transistor. Moreover, trenches 13 are formed in the surface of a laminated oxide film of the silicon oxide film 9/silicon oxide film 11 below the area around and outside the periphery of the lower electrodes of the capacitor. Dummy plugs (frames) are provided in the trenches 13 later for protection.

Figure 6:
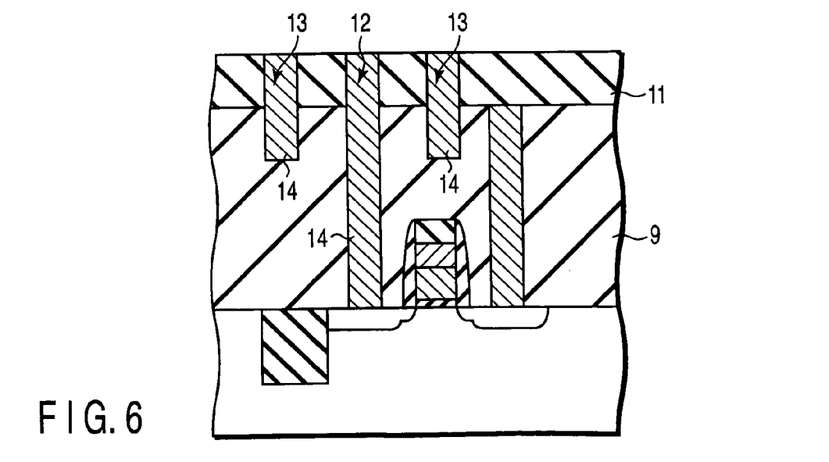
FIG. 6 is a sectional view showing a continued part of the process of manufacturing a COP type FeRAM according to the embodiment, shown in FIG. 5.

Then, the process proceeds to the step shown in FIG. 6. First, the polycrystalline silicon films 14 are deposited all over the surface by the CVD process so as to be buried in the contact hole 12 and trenches 13. Subsequently, the polycrystalline silicon films 14 outside the contact hole 12 and trenches 13 are removed by the CMP process.

Figure 7:
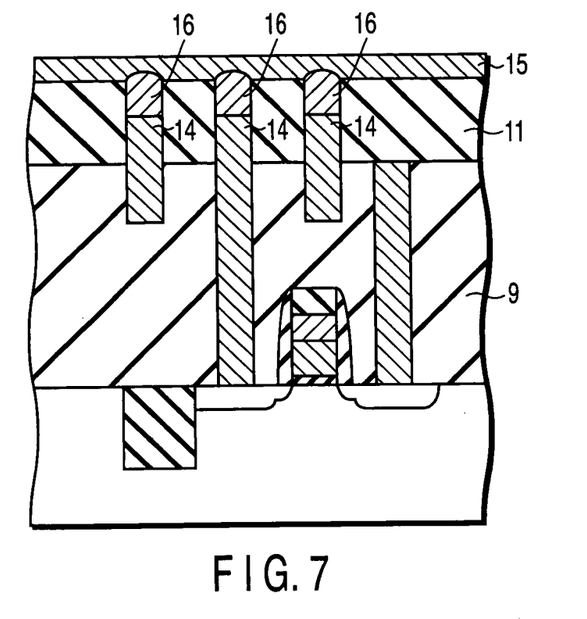
FIG. 7 is a sectional view showing a continued part of the process of manufacturing a COP type FeRAM according to the embodiment, shown in FIG. 6.

Then, the process proceeds to the step shown in FIG. 7. First, a refractory metal film 15 such as a titanium or cobalt film is deposited all over the surface by a sputter process. Subsequently, the polycrystalline silicon film 14 and the refractory metal film 15 are allowed to react with each other to change the upper parts of the polycrystalline silicon films 14 to metal silicide films (for example, titanium or cobalt silicide films) 16. The CVD process may be used in place of the sputter process.

Figure 8:
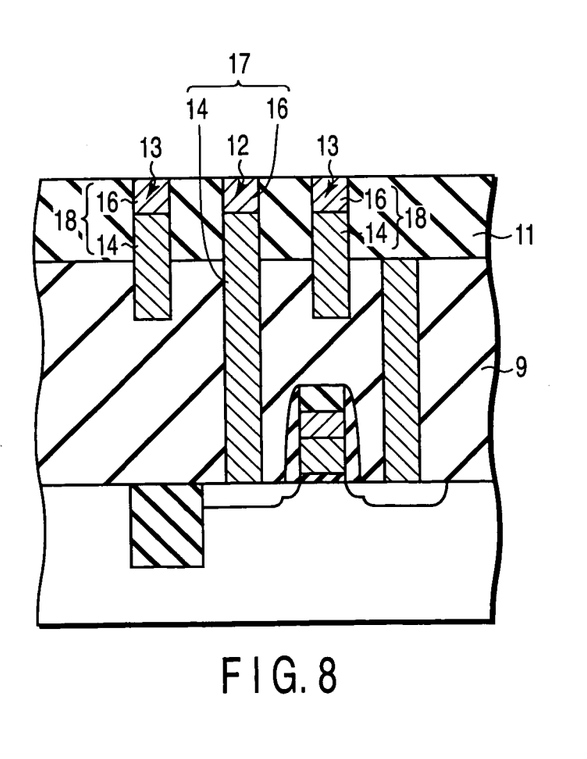
FIG. 8 is a sectional view showing a continued part of the process of manufacturing a COP type FeRAM according to the embodiment, shown in FIG. 7.

Then, the process proceeds to the step shown in FIG. 8. First, the metal silicide films 16 and refractory metal film 15 outside the contact hole 12 and trenches 13 are removed and the surfaces of these films are flattened by the CMP process. As a result, a plug 17 including the polycrystalline silicon film 14 and the metal silicide film 16 is formed in the contact hole 12 and dummy plugs 18 including the polycrystalline silicon film 14 and the metal silicide film 16 are formed in the trenches 13.

A noble metal such as iridium and its oxide ($IrO_2$) as well as an oxide of the noble metal is likely to react with silicon. Thus, iridium in the iridium film 21 used as upper electrodes is likely to react with silicon in the polycrystalline silicon film 14. The metal silicide film 16 prevents such reaction.

Figure 9:
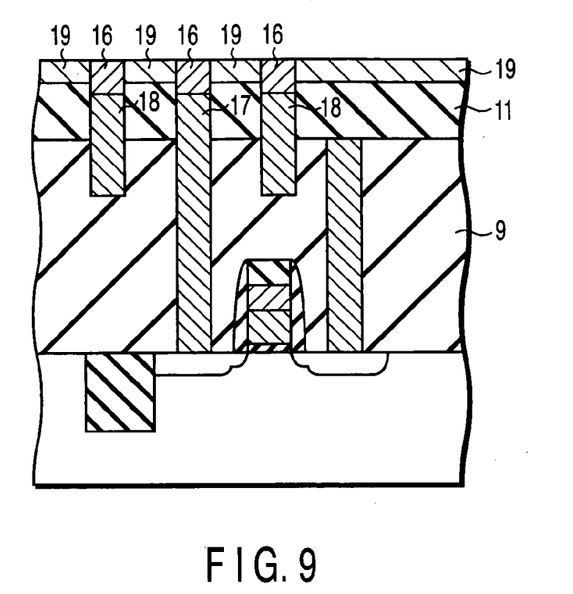
FIG. 9 is a sectional view showing a continued part of the process of manufacturing a COP type FeRAM according to the embodiment, shown in FIG. 8.

Then, the process proceeds to the step shown in FIG. 9. First, the surface of the metal silicide film 16 is treated using a diluted fluoric acid. An oxide film such as a native oxide film is likely to be formed on the surface of the metal silicide film 16. Such an oxide film may cause an increase in contact resistance. Thus, in the present embodiment, the oxide film is removed by the treatment using the diluted fluoric acid.

On this occasion, the silicon oxide film 11 is etched by about 30 nm. As a result, the upper ends of the plug 17 and dummy plug 18 project from the surface of the silicon oxide film 11 to form trenches.

Then, the titanium film 19 is deposited all over the surface by the sputter process or CVD process. Accordingly, the trenches created by etching the silicon oxide film 11 are filled with the titanium film 19. Subsequently, the surface of the area including the plug 17, dummy plug 18, and titanium film 19 is flattened. A titanium compound film, for example, titanium nitride film, can be used in place of the titanium film 19.

Figure 10:
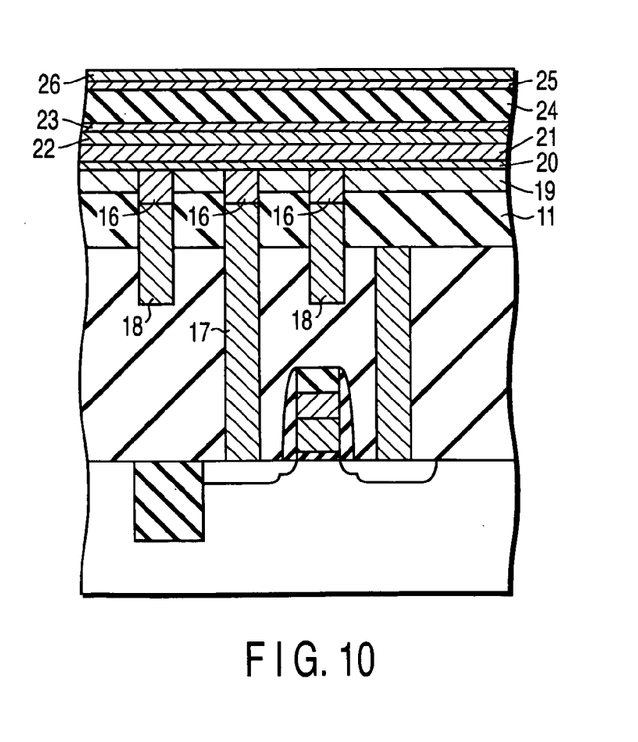
FIG. 10 is a sectional view showing a continued part of the process of manufacturing a COP type FeRAM according to the embodiment, shown in FIG. 9.

Then, the process proceeds to the step shown in FIG. 10. First, a titanium film 20 of thickness about 3 nm, an iridium film 21 of thickness 30 nm, a first platinum film 22 of thickness 20 nm, and a first SRO ($SrRuO_3$) film 23 are sequentially deposited all over the surface.

In this case, since the surface of the area including the plug 17, the dummy plug 18, and the titanium film 19 has been flattened, the titanium film 20, the iridium film 21, the first platinum film 22, and the first SRO film 23 are prevented from peeling off. Moreover, the metal silicide film 16 in the plug 17 does not include any projecting portions. This in principle avoids problems such as an increase in contact resistance caused by a crack in a projecting portion of the metal silicide film 16.

Even if a structure is employed in which the trenches formed by etching the silicon oxide film 11 are not filled with the titanium film 19, the presence of the dummy plugs 18 improves the flatness of the surface of the area in which the titanium film 20, the iridium film 21, the first platinum film 22, and the first SRO film 23 are formed. Consequently, also in this case, it is expected to be possible to prevent the peel-off of the titanium film 20, the iridium film 21, the first platinum film 22, and the first SRO film 23.

Then, the PZT film 24 to be processed into a capacitor dielectric film is deposited on the first SRO film 23 by the sputter process. Subsequently, the PZT film 24 is crystallized by rapid thermal annealing (RTA) in an oxygen atmosphere. Then, a second SRO film 25 and a second platinum film 26 are deposited on the PZT film 24 by the sputter process. The capacitor dielectric film may be a ferroelectric film such as an SBT film instead of the PZT film 24.

Figure 11:
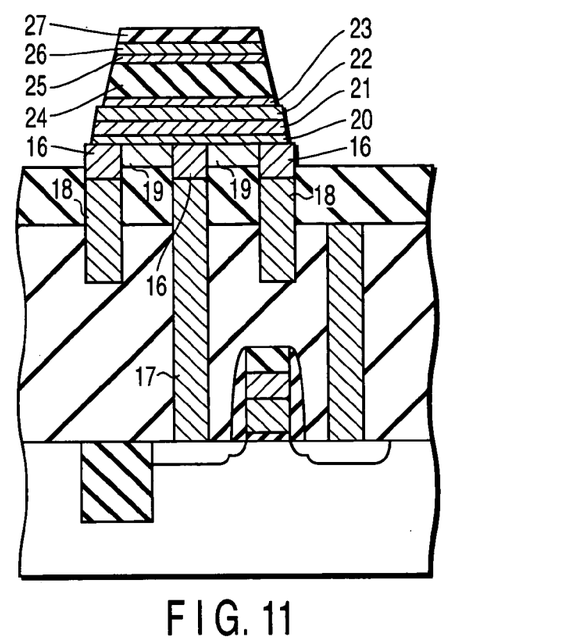
FIG. 11 is a sectional view showing a continued part of the process of manufacturing a COP type FeRAM according to the embodiment, shown in FIG. 10.

Then, the process proceeds to the step shown in FIG. 11. First, a silicon oxide film is deposited on the second platinum film 26 by the CVD process. Subsequently, the silicon oxide film is processed by the photolithography and RIE processes to form a mask 27 made of silicon oxide. Then, the mask 27 is used to etch the second platinum film 26, the second SRO film 25, and the PZT film 24 by the RIE process to obtain upper electrodes 25 and 26 and a capacitor dielectric film 24.

Then, the first SRO film 23, the first platinum film 22, the iridium film 21, and the titanium film 20 are processed by the photolithography and RIE processes to obtain lower electrodes 20 to 23. A chlorine-based etching gas is used for the RIE process.

Here, in the present embodiment, the metal silicide films 16 of the dummy plugs 18 are arranged below the area including the periphery and outside of a part of the titanium film 20 which is processed into the lower electrodes. The metal silicide film 16 has a lower etching rate than the titanium film 20. Thus, the etching of the titanium film 20 by the RIE process stops on the metal silicide films 16 of the dummy plugs 18. This prevents the etching of the titanium film 19 which may result in faulty contacts.

The process of manufacturing the capacitor which is a component of the COP type FeRAM is completed through the above steps.

Here, the lower electrodes 20 to 23 are conductive films including the titanium film, the iridium film, the platinum film, and the SRO film. However, the lower electrodes 20 to 23 may be other conductive films. For example, it is possible to use a conductive film including a ruthenium film or a conductive film including a compound conductive film such as a strontium ruthenium oxide film.

Then, a silicon oxide film 28 is deposited all over the surface so as to cover the COP type FeRAM (FIG. 2). Subsequently, a thermal treatment is executed at about 600° C. in the oxygen atmosphere to eliminate damage occurred in the capacitor dielectric film (PZT film) 23 during the process of manufacturing the COP type FeRAM.

At this time, a part of oxygen permeating through the COP type FeRAM reaches the lower electrodes 20 and 21. However, the polycrystalline silicon film 14 which is a component of the plug 17 and the dummy plugs 18 is prevented from being oxidized.

This is partly because the iridium film which is a component of the lower electrode 20 has an effect of suppressing the oxygen diffusion. Another reason is that the metal silicide film 16 has a high diffusion barrier, thus oxidization of the polycrystalline silicon film 14 located below the metal silicide film 16 is prevented.

On the other hand, the iridium film and platinum film which are components of the lower electrodes 21 and 22 do not react with polycrystalline silicon film 14 by the presence of the metal silicide film 16. As a result, the thermal treatment in the oxygen atmosphere does not bring about any trouble to the lower electrodes 20 and 21.

Subsequently, the FeRAM is completed through well-known steps, that is, a step of forming a contact that is in communication with the plug 10, a step of forming drive lines, a step of forming bit lines, further a step of forming upper metal interconnects and the like.

Figure 12:
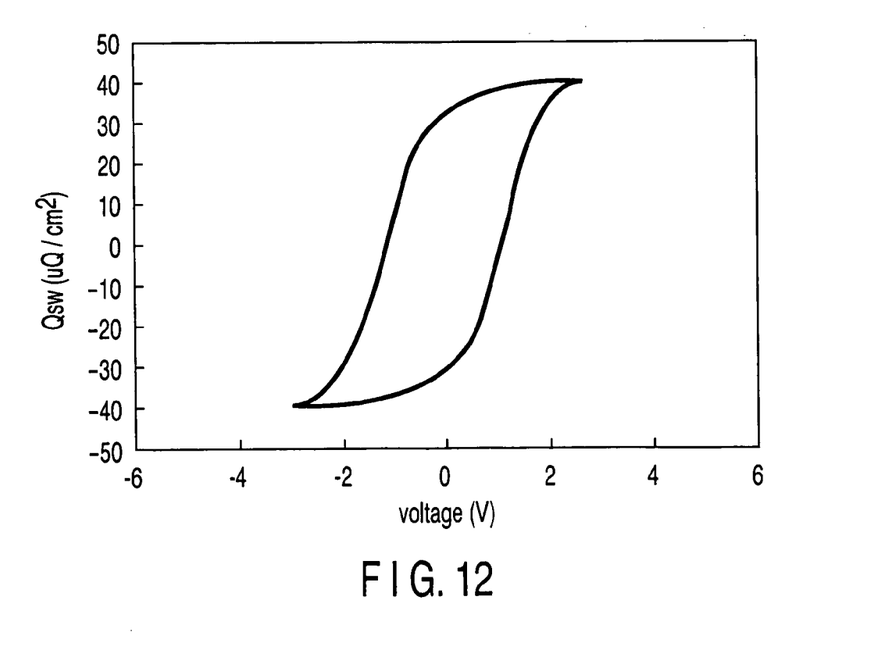
FIG. 12 is a diagram showing the hysteresis characteristic of a capacitor in the COP type FeRAM according to the embodiment.

FIG. 12 shows the hysteresis characteristic of the COP type FeRAM according to the present embodiment. FIG. 12 indicates that the capacitor according to the present embodiment has a favorable hysteresis characteristic.

In the above embodiment, the cell structure of the ferroelectric random access memory is not specifically described. For example, it is possible to use the cell structure described below. That is, the present embodiment is applicable to a memory which comprises series connected memory cells each having a transistor having a source terminal and a drain terminal and a ferroelectric capacitor in between said two terminals, hereafter named "Series connected TC unit type ferroelectric RAM".

Further, in the description of the above embodiment, the present invention is applied to the FeRAM. However, the present invention is applicable to a stacked DRAM. In this case, the capacitor dielectric film is a high dielectric film. A material for the high dielectric film may be, for example, $Ta_2O_5$ or $(Ba, Sr)TiO_3$.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate including a diffusion area;
   a capacitor provided above the semiconductor substrate and including a lower electrode, a dielectric film, and an upper electrode, the lower electrode being flat;
   a plug provided between the semiconductor substrate and the capacitor and having a lower end connected to the diffusion area and an upper end connected to the lower electrode; and
   a dummy plug provided between the semiconductor substrate and the capacitor and having a lower end not connected to the diffusion area and an upper end connected to the lower electrode and not connected to the upper electrode.

2. The semiconductor device according to claim 1, wherein the dummy plug is placed below an area including a periphery and outside of the lower electrode.

3. The semiconductor device according to claim 1, further comprising an insulating film provided between the semiconductor substrate and the capacitor, wherein the plug and the dummy plug are provided in the insulating film, and upper ends of the plug and dummy plug project from a surface of the insulating film.

4. The semiconductor device according to claim 2, further comprising an insulating film provided between the semiconductor substrate and the capacitor, wherein the plug and the dummy plug are provided in the insulating film, and upper ends of the plug and dummy plug project from a surface of the insulating film.

5. The semiconductor device according to claim 3, further comprising metal or its compound which fills an area between the upper ends of the plug and dummy plug projecting from the surface of the insulating film.

6. The semiconductor device according to claim 4, further comprising metal or its compound which fills an area between the upper ends of the plug and dummy plug projecting from the surface of the insulating film.

7. The semiconductor device according to claim 5, wherein the metal or its compound is titanium or titanium nitride.

8. The semiconductor device according to claim 6, wherein the metal or its compound is titanium or titanium nitride.

9. The semiconductor device according to claim 1, wherein the plug and the dummy plug comprise the same material.

10. The semiconductor device according to claim 2, wherein the plug and the dummy plug comprise the same material.

11. The semiconductor device according to claim 9, wherein the plug and dummy plug projecting from the surface of the insulating film comprises a material which is etched at a lower etching rate than the lower electrode.

12. The semiconductor device according to claim 10, wherein the plug and dummy plug projecting from the surface of the insulating film comprise a material which is etched at a lower etching rate than the lower electrode.

13. The semiconductor device according to claim 11, wherein the plug and dummy plug projecting from the surface of the insulating film comprise a material which is etched at a lower etching rate than the lower electrode.

14. The semiconductor device according to claim 3, wherein the plug and dummy plug in the insulating film comprise a semiconductor, and the plug and dummy plug projecting from the surface of the insulating film comprise a compound of the semiconductor and a refractory metal.

15. The semiconductor device according to claim 1, wherein the diffusion area is a source/drain area of a MOS transistor.

16. The semiconductor device according to claim 15, wherein the dielectric film is a ferroelectric film, and the MOS transistor and the capacitor are for a ferroelectric random access memory.

17. A method for manufacturing a semiconductor device comprising:
   forming an insulating film on a semiconductor substrate including a diffusion area;
   forming a connection hole in the insulating film which reaches the diffusion area and forming a trench in a surface of the insulating film;
   filling an inside of the connection hole and trench with a semiconductor film;
   forming a refractory metal film on the insulating film and semiconductor film;
   executing a thermal treatment to allow the semiconductor film and the refractory metal film to react with each other to form a compound film of the semiconductor film and refractory metal film;
   removing the refractory metal film and compound film outside the connection hole and trench and forming a plug and a dummy plug each including the semiconductor film and the refractory metal film inside the connection hole and the trench, respectively;
   removing an oxide film formed on a surface of the compound film;
   burying metal or its compound in a removed area in a surface of the insulating film between the connection hole and the trench which area results from the removal of the oxide film; and
   forming a capacitor including a lower electrode, a dielectric film, and an upper electrode on the insulating film, the lower electrode having a lower end being connected to upper ends of the plug and dummy plug.

18. The method for manufacturing a semiconductor device according to claim 17, wherein burying the metal or its compound in the removed area in the surface of the insulating film between the connection hole and the trench which area results from the removal of the oxide film comprises depositing a film containing the metal or its compound and polishing the film containing the metal or its compound.

19. The method for manufacturing a semiconductor device according to claim 17, wherein the insulating film is a silicon oxide film, and removing the oxide film formed on the surface of the compound film is carried out by a treatment using a diluted fluoric acid.

20. The method for manufacturing a semiconductor device according to claim 18, wherein the insulating film is a silicon oxide film, and removing the oxide film formed on the surface of the compound film is carried out by a treatment using a diluted fluoric acid.

* * * * *